(12) United States Patent
Chen et al.

(10) Patent No.: US 8,217,473 B2
(45) Date of Patent: Jul. 10, 2012

(54) MICRO ELECTRO-MECHANICAL SYSTEM PACKAGING AND INTERCONNECT

(75) Inventors: Chien-Hua Chen, Corvallis, OR (US); John Bamber, Corvallis, OR (US); Henry Kang, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 897 days.

(21) Appl. No.: 11/192,945

(22) Filed: Jul. 29, 2005

(65) Prior Publication Data

US 2007/0128828 A1 Jun. 7, 2007

(51) Int. Cl.
*H01L 27/14* (2006.01)
(52) U.S. Cl. .. 257/414; 257/704; 257/730; 257/E31.117
(58) Field of Classification Search .................. 438/780, 438/106, 48, 458; 257/730, 704, 414; 29/854; 428/137
See application file for complete search history.

(56) References Cited

U.S. PATENT DOCUMENTS

| | | | |
|---|---|---|---|
| 3,599,054 A | 8/1971 | Lepselter et al. | |
| 3,616,380 A | 10/1971 | Lepselter et al. | |
| 5,260,233 A * | 11/1993 | Buti et al. | 438/165 |
| 5,679,436 A * | 10/1997 | Zhao | 428/141 |
| 5,963,788 A * | 10/1999 | Barron et al. | 438/48 |
| 6,297,072 B1 * | 10/2001 | Tilmans et al. | 438/106 |
| 6,479,320 B1 | 11/2002 | Gooch | |
| 6,592,128 B2 | 7/2003 | White | |
| 6,673,697 B2 | 1/2004 | Ma et al. | |
| 6,674,159 B1 * | 1/2004 | Peterson et al. | 257/680 |
| 6,743,656 B2 | 6/2004 | Orcutt et al. | |
| 6,782,616 B2 * | 8/2004 | Eldredge | 29/854 |
| 6,788,046 B2 | 9/2004 | Lenhard et al. | |
| 6,822,326 B2 | 11/2004 | Enquist et al. | |
| 6,841,861 B2 * | 1/2005 | Brady | 257/678 |
| 7,172,978 B2 * | 2/2007 | Liao et al. | 438/780 |
| 7,202,560 B2 * | 4/2007 | Dungan et al. | 257/713 |
| 7,250,353 B2 * | 7/2007 | Nasiri et al. | 438/460 |
| 7,422,570 B2 * | 9/2008 | Gerlach et al. | 604/154 |
| 2002/0000649 A1 | 1/2002 | Tilmans et al. | |
| 2002/0167135 A1 | 11/2002 | White | |
| 2003/0211705 A1 * | 11/2003 | Tong et al. | 438/455 |
| 2004/0016989 A1 | 1/2004 | Ma et al. | |
| 2004/0020782 A1 | 2/2004 | Cohen et al. | |
| 2004/0026785 A1 | 2/2004 | Tomita | |
| 2004/0051181 A1 | 3/2004 | Ma et al. | |
| 2004/0061192 A1 | 4/2004 | Yun et al. | |
| 2004/0066258 A1 * | 4/2004 | Cohn et al. | 335/78 |
| 2004/0087053 A1 | 5/2004 | Lytle et al. | |

(Continued)

FOREIGN PATENT DOCUMENTS

FR 2763745 11/1998

(Continued)

OTHER PUBLICATIONS

Transmittal of the International Search Report and the Written Opinion of the International Searching Authority dated Nov. 23, 2006.

*Primary Examiner* — Ahmed Sefer

(57) ABSTRACT

A micro electro-mechanical system (MEMS) device includes an electrical wafer, a mechanical wafer, a plasma treated oxide seal bonding the electrical wafer to the mechanical wafer, and an electrical interconnect between the electrical wafer and the mechanical wafer.

26 Claims, 3 Drawing Sheets

U.S. PATENT DOCUMENTS

| | | |
|---|---|---|
| 2004/0094835 A1 | 5/2004 | Maghribi et al. |
| 2004/0147056 A1* | 7/2004 | McKinnell et al. ............. 438/52 |
| 2004/0188843 A1 | 9/2004 | Wakayama et al. |
| 2004/0268286 A1* | 12/2004 | New et al. ........................ 716/14 |
| 2005/0009246 A1 | 1/2005 | Enquist et al. |
| 2005/0085052 A1* | 4/2005 | Chen et al. .................... 438/471 |
| 2006/0001147 A1* | 1/2006 | Tomita et al. ................. 257/690 |
| 2006/0076664 A1* | 4/2006 | Chen et al. .................... 257/686 |
| 2006/0093787 A1* | 5/2006 | Chen et al. .................... 428/137 |
| 2006/0125084 A1* | 6/2006 | Fazzio et al. ................... 257/704 |
| 2006/0226524 A1* | 10/2006 | Chen et al. .................... 257/680 |
| 2006/0237810 A1* | 10/2006 | Sand et al. ..................... 257/434 |
| 2006/0252229 A1* | 11/2006 | Joly et al. ...................... 438/455 |

FOREIGN PATENT DOCUMENTS

| | | |
|---|---|---|
| FR | 2856844 | 12/2004 |
| WO | WO01/56921 | 8/2001 |
| WO | WO2005/058748 | 6/2005 |

* cited by examiner

MICRO ELECTRO-MECHANICAL SYSTEM PACKAGING AND INTERCONNECT

BACKGROUND

Micro electro-mechanical system (MEMS) devices include micro-machine substrates integrated with electronic microcircuits. Such MEMS devices may form, for example, microsensors or microactuators which operate based on, for example, electromagnetic, electrostrictive, thermoelectric, piezoelectric, or piezoresistive effects. MEMS devices are fabricated on insulators or other substrates using microelectronic techniques such as photolithography, vapor deposition, and etching.

Typically, the electrical portion of a MEMS device and the mechanical portion of a MEMS device are fabricated on separate wafers and then bonded together to form the MEMS device. The bonding of the electrical and mechanical portions may be performed at either wafer level processing or at die level processing. At either wafer level processing or die level processing, solder is typically used to bond the electrical portions to the mechanical portions and to provide electrical interconnects between the electrical portions and the mechanical portions to form a MEMS device. During the soldering process, misalignment may occur due to thermal and/or mechanical shifting. This misalignment may result in reduced yields.

For these and other reasons, there is a need for the present invention.

SUMMARY

One aspect of the present invention provides a micro electro-mechanical system (MEMS) device. The MEMS device includes an electrical wafer, a mechanical wafer, a plasma treated oxide seal bonding the electrical wafer to the mechanical wafer, and an electrical interconnect between the electrical wafer and the mechanical wafer.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims.

Figure 1:
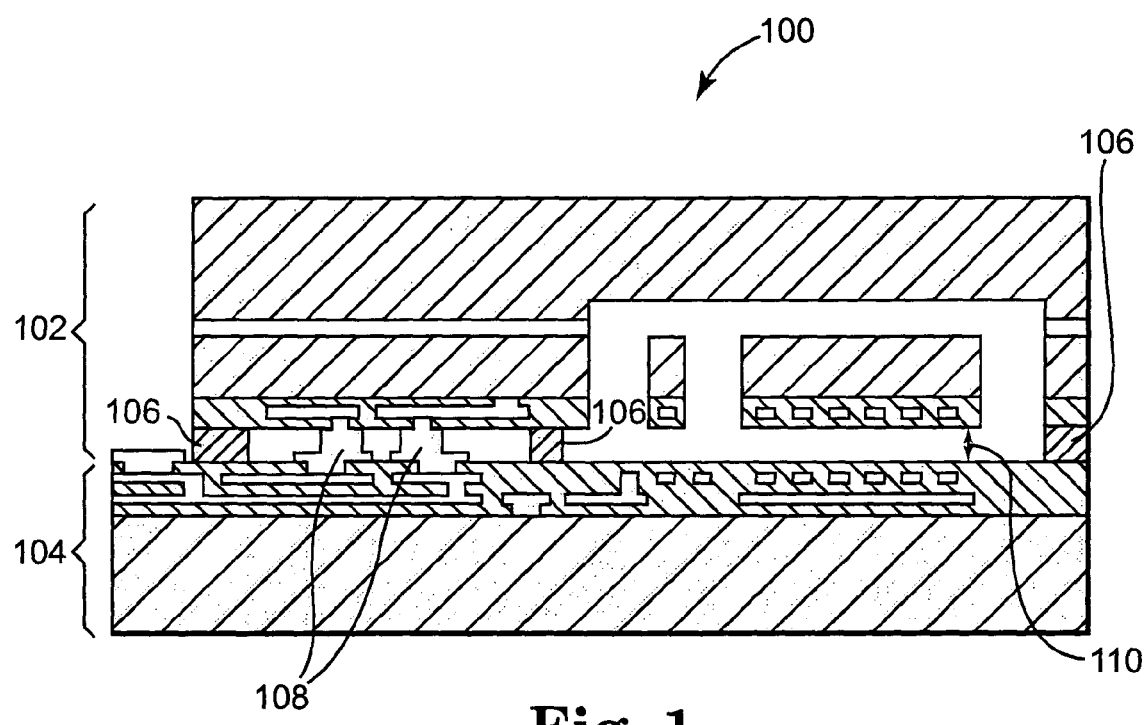
FIG. 1 illustrates a cross-sectional view of one embodiment of a micro electro-mechanical system (MEMS) device.

FIG. 1 illustrates a cross-sectional view of one embodiment of a micro electro-mechanical system (MEMS) device 100. MEMS device 100 includes a mechanical wafer (M-wafer) 102 and an electrical wafer (E-wafer) 104. M-wafer 102 is bonded to E-wafer 104 employing plasma treated oxide seal rings 106 and solder interconnects 108.

In one embodiment, plasma treated oxide seal rings 106 enclose solder interconnects 108 and portions of M-wafer 102 and E-wafer 104.

Bonding of M-wafer 102 to E-wafer 104 is implemented at wafer level or die level processing. In one embodiment, plasma treated oxide seal rings 106 bond M-wafer 102 to E-wafer 104 at room temperature such that the two wafers are aligned and locked in place. In one embodiment, plasma treated oxide seal rings 106 bond M-wafer 102 to E-wafer 104 spontaneously upon contact. In one embodiment, plasma treated oxide seal rings 106 also precisely set a gap 110 between M-wafer 102 and E-wafer 104 to a desired value.

In one embodiment, solder interconnects 108 are formed between M-wafer 102 and E-wafer 104 after plasma treated oxide seal rings 106 bond M-wafer 102 to E-wafer 104 and set gap 110 between the wafers. In one embodiment, the bonded M-wafer 102 and E-wafer 104 are annealed to reflow solder material deposited on M-wafer 102 and/or E-wafer 104 to form electrical 3D interconnects 108 between M-wafer 102 and E-wafer 104.

In one embodiment, M-wafer 102 includes micromovers or other suitable micro mechanical devices. In one embodiment, E-wafer 104 includes complimentary metal-oxide-semiconductor (CMOS) circuits or other suitable circuits for interconnecting with the micromovers to form MEMS devices, such as MEMS device 100.

Plasma treated oxide seal rings 106 can provide greatly improved alignment between M-wafer 102 and E-wafer 104 compared to solder bonding techniques. In addition, overall bond strength can be enhanced significantly over solder bonding techniques. The enhanced alignment and bond strength can provide higher process margins and higher yields during manufacturing. Plasma treated oxide seal rings 106 also enable precisely aligned 3D architectures in wafer or die integration and packaging. Furthermore, in one embodiment, hermetic packaging with interconnects is achieved with plasma treated oxide seal rings 106.

Figure 2:
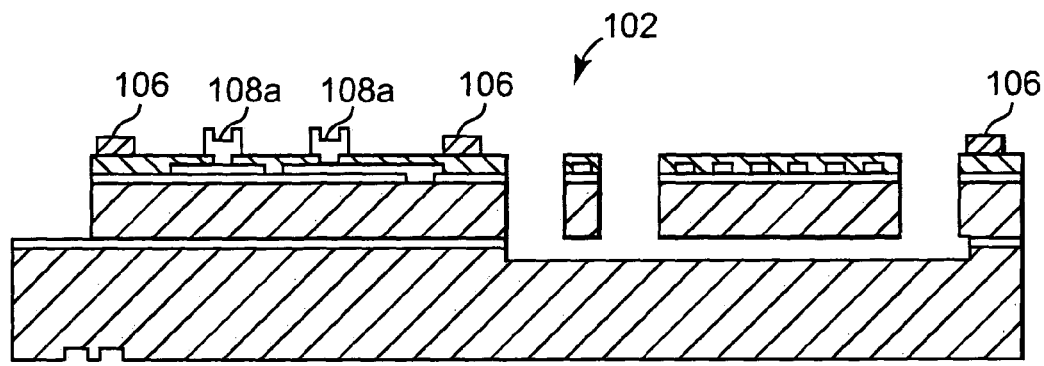
FIG. 2 illustrates a cross-sectional view of one embodiment of a mechanical wafer.

FIG. 2 illustrates a cross-sectional view of one embodiment of M-wafer 102. In one embodiment, seal ring material, such as $SiO_2$ or another suitable material, is patterned on M-wafer 102 using a photolithography process to obtain the desired bonding points and gap 110. In one embodiment, solder bumps 108a are also provided on M-wafer 102 for forming electrical interconnects. In one embodiment, the seal ring material and/or the solder bumps are provided on E-wafer 104 instead of on M-wafer 102. In another embodiment, seal material is patterned on both M-wafer 102 and E-wafer 104.

In one embodiment, seal rings 106 are treated with plasma, such as an oxygen plasma or nitrogen plasma. This plasma treatment prepares seal rings 106 for immediate bonding on contact with another $SiO_2$ surface or another suitable surface.

Figure 3:
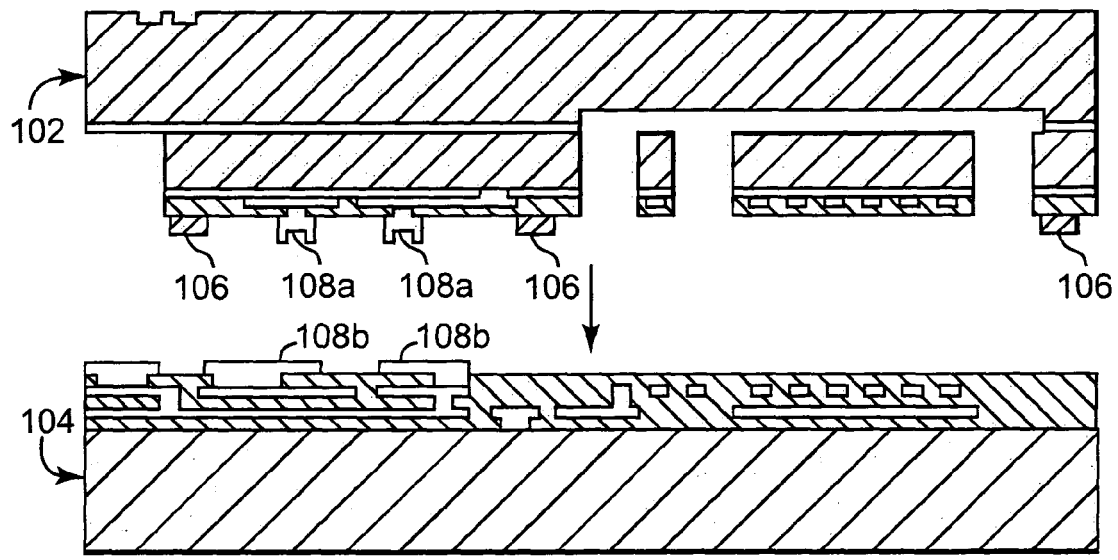
FIG. 3 illustrates a cross-sectional view of one embodiment of aligning a mechanical wafer and an electrical wafer for bonding.

FIG. 3 illustrates a cross-sectional view of one embodiment of aligning M-wafer 102 and E-wafer 104 for bonding. In this embodiment, M-wafer 102 is aligned with E-wafer 104. Plasma treated oxide seal rings 106 then contact the $SiO_2$ surface of E-wafer 104. In one embodiment, M-wafer 102 bonds to E-wafer 104 at room temperature spontaneously upon contact of plasma treated oxide seal rings 106 to the SiO2 surface of E-wafer 104.

M-wafer 102 and E-wafer 104 are then annealed to reflow solder 108a. The reflowed solder 108a a provides electrical 3D interconnects 108 between M-wafer 102 and electrical contacts 108b of E-wafer 104. The combination of the plasma treated oxide seal rings 106 and electrical 3D interconnects 108 bond the aligned M-wafer 102 and E-wafer 104 to form MEMS device 100 illustrated in FIG. 1.

Figure 4:
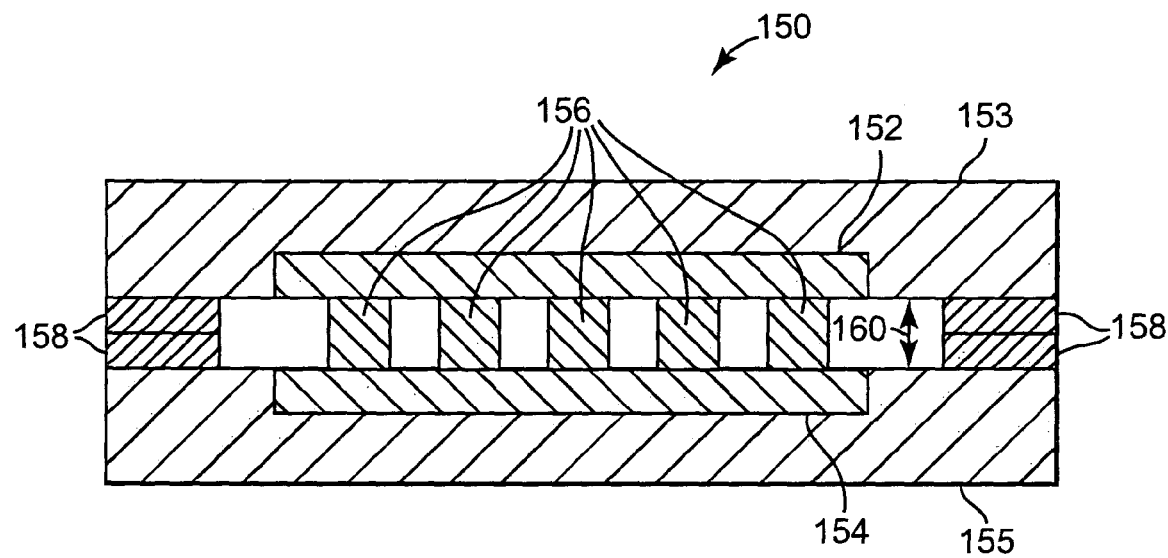
FIG. 4 illustrates a cross-sectional view of one embodiment of two chips bonded in a face to face configuration.

FIG. 4 illustrates a cross-sectional view of one embodiment of two chips bonded in a face to face configuration to form device 150. Device 150 includes chip 152 in package 153, chip 154 in package 155, electrical interconnects 156, and plasma treated oxide seal rings 158.

Oxide seal rings 158 are patterned on package 153, package 155, or both package 153 and package 155 to obtain the desired bonding points and a desired gap 160. In one embodiment, the oxide seal rings 158 are then plasma treated. The face of chip 152 is aligned with the face of chip 154 and plasma treated oxide seal rings 158 are bonded upon contact. In one embodiment, device 150 is then annealed to reflow the solder to form electrical interconnects 156 between chip 152 and chip 154.

Figure 5:
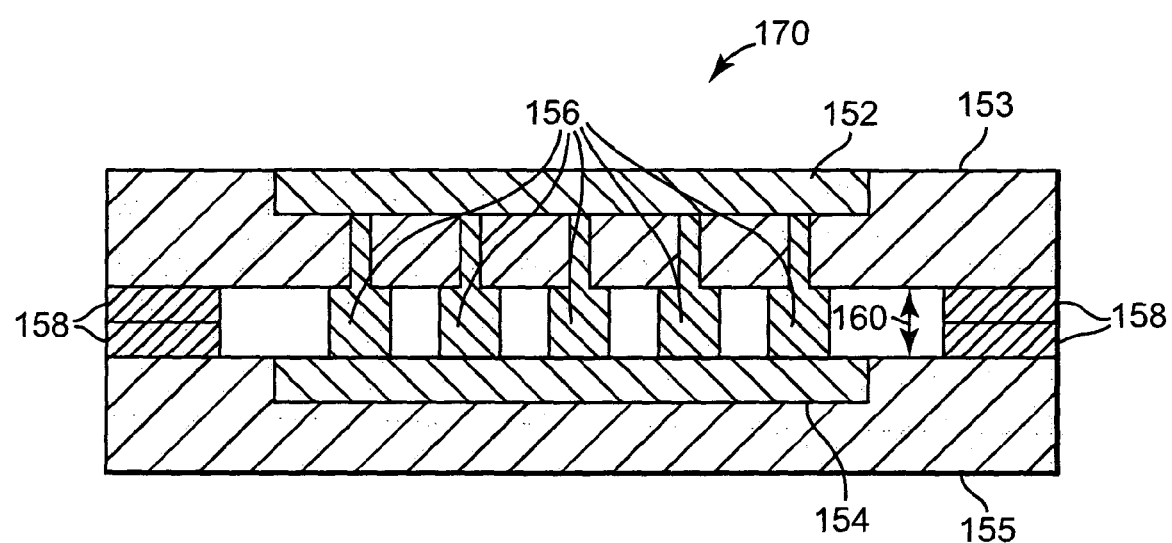
FIG. 5 illustrates a cross-sectional view of one embodiment of two chips bonded in a back to face configuration.

FIG. 5 illustrates a cross-sectional view of one embodiment of two chips bonded in a back to face configuration to form device 170. Device 170 includes chip 152 in package 153, chip 154 in packaging 155, electrical interconnects 156, and plasma treated oxide seal rings 158.

Oxide seal rings 158 are patterned on package 153, package 155, or both package 153 and package 155 to obtain the desired bonding points and a desired gap 160. In one embodiment, the oxide seal rings 158 are then plasma treated. The back of chip 152 is aligned with the face of chip 154 and plasma treated oxide seal rings 158 are bonded upon contact. In one embodiment, device 170 is then annealed to reflow the solder to form electrical interconnects 156 between chip 152 and chip 154.

Embodiments of the invention provide a low temperature plasma bond to tack the wafers or dies in place before implementing the high temperature solder reflow for forming the electrical interconnects. Embodiments of plasma treated oxide seal rings improve the alignment accuracy and substantially eliminate any misalignment due to material expansion, thermal effects, mechanical shift, etc.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A micro electro-mechanical system (MEMS) device comprising:
    a first wafer comprising an oxide surface;
    a second wafer comprising a plasma treated oxide seal ring; and
    an electrical interconnect between the first wafer and the second wafer,
    wherein the plasma treated oxide seal ring is directly bonded to the oxide surface of the first wafer,
    wherein the first wafer comprises an electrical wafer, and
    wherein the second wafer comprises a mechanical wafer including a micro mechanical device.

2. The MEMS device of claim 1, wherein the electrical interconnect comprises solder.

3. The MEMS device of claim 1, wherein the first wafer comprises a complementary metal-oxide-semiconductor (CMOS) circuit.

4. The MEMS device of claim 1, wherein the second wafer comprises a micromover.

5. The MEMS device of claim 1, wherein the plasma treated oxide seal ring comprises plasma treated $SiO_2$.

6. The MEMS device of claim 1, wherein the plasma treated oxide seal ring provides a hermetic seal.

7. The MEMS device of claim 1, wherein the plasma treated oxide seal ring directly bonds only surfaces parallel to the first wafer and the second wafer.

8. A micro electro-mechanical system (MEMS) device comprising:
    a first chip in a first package comprising an oxide surface, the first package contacting a first surface of the first chip, a second surface of the first chip opposite the first surface of the first chip, and a third surface of the first chip extending between the first and second surfaces of the first chip;
    a second chip in a second package comprising a plasma treated oxide seal ring, the second package contacting a first surface of the second chip, a second surface of the second chip opposite the first surface of the second chip, and a third surface of the second chip extending between the first and second surfaces of the second chip; and
    an electrical interconnect between the first chip and the second chip,
    wherein the plasma treated oxide seal ring is directly bonded to the oxide surface of the first package.

9. The MEMS device of claim 8, wherein the electrical interconnect bonds a face of the first chip to a face of the second chip.

10. The MEMS device of claim 8, wherein the electrical interconnect bonds a face of the first chip to a back of the second chip.

11. The MEMS device of claim 8, wherein the electrical interconnect comprises solder.

12. The MEMS device of claim 8, wherein the plasma treated oxide seal ring comprises plasma treated $SiO_2$.

13. The MEMS device of claim 8, wherein the plasma treated oxide seal ring provides a hermetic seal.

14. The MEMS device system of claim 8, wherein the plasma treated oxide seal ring directly bonds only surfaces parallel to the first chip and the second chip.

15. A micro electro-mechanical system (MEMS) device comprising:
    an electrical die comprising an oxide surface;
    a mechanical die comprising a surface and a micro mechanical device;
    a plasma treated oxide seal ring directly contacting the oxide surface of the electrical die and the surface of the mechanical die to bond the electrical die to the mechanical die; and
    an electrical interconnect between the electrical die and the mechanical die,
    wherein the surface of the mechanical die is suitable for immediate bonding on contact with the plasma treated oxide seal ring.

16. The MEMS device system of claim 15, wherein the electrical interconnect comprises solder.

17. The MEMS device of claim 15, wherein the electrical die comprises a complementary metal-oxide-semiconductor (CMOS) circuit.

18. The MEMS device of claim 15, wherein the mechanical die comprises a micromover.

19. The MEMS device of claim 15, wherein the plasma treated oxide seal ring comprises plasma treated $SiO_2$.

20. The MEMS device of claim 15, wherein the plasma treated oxide seal ring provides a hermetic seal.

21. A micro electro-mechanical system (MEMS) device comprising:
   a first wafer comprising a first oxide seal ring;
   a second wafer comprising a plasma treated oxide seal ring; and
   an electrical interconnect between the first wafer and the second wafer,
   wherein the plasma treated oxide seal ring is directly bonded to the first oxide seal ring,
   wherein the first wafer comprises an electrical wafer, and
   wherein the second wafer comprises a mechanical wafer including a micro mechanical device.

22. The MEMS device of claim 21, wherein the electrical interconnect comprises solder.

23. The MEMS device of claim 21, wherein the first wafer comprises a complementary metal-oxide-semiconductor (CMOS) circuit, and
   wherein the second wafer comprises a micromover.

24. The MEMS device of claim 21, wherein the plasma treated oxide seal ring comprises plasma treated $SiO_2$.

25. The MEMS device of claim 21, wherein the plasma treated oxide seal ring provides a hermetic seal.

26. The MEMS device of claim 21, wherein the plasma treated oxide seal ring directly bonds only surfaces parallel to the first wafer and the second wafer.

* * * * *

UNITED STATES PATENT AND TRADEMARK OFFICE
CERTIFICATE OF CORRECTION

| | |
|---|---|
| PATENT NO. | : 8,217,473 B2 |
| APPLICATION NO. | : 11/192945 |
| DATED | : July 10, 2012 |
| INVENTOR(S) | : Chien-Hua Chen et al. |

It is certified that error appears in the above-identified patent and that said Letters Patent is hereby corrected as shown below:

In column 4, line 46, in Claim 14, after "device" delete "system".

In column 4, line 63, in Claim 16, after "device" delete "system".

Signed and Sealed this
First Day of January, 2013

David J. Kappos
*Director of the United States Patent and Trademark Office*